United States Patent
Lu

(10) Patent No.: US 12,278,149 B2
(45) Date of Patent: Apr. 15, 2025

(54) THROUGH-SUBSTRATE VIA TEST STRUCTURE

(71) Applicant: Powerchip Semiconductor Manufacturing Corporation, Hsinchu (TW)

(72) Inventor: Chun-Lin Lu, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 400 days.

(21) Appl. No.: 17/719,400

(22) Filed: Apr. 13, 2022

(65) Prior Publication Data

US 2023/0290695 A1 Sep. 14, 2023

(30) Foreign Application Priority Data

Mar. 9, 2022 (TW) .................................. 111108657

(51) Int. Cl.
 H01L 23/48 (2006.01)
 H01L 21/66 (2006.01)

(52) U.S. Cl.
 CPC ............ H01L 22/32 (2013.01); H01L 23/481 (2013.01)

(58) Field of Classification Search
 CPC ......... H01L 22/32; H01L 22/14; H01L 22/34; H01L 23/481
 See application file for complete search history.

(56) References Cited

U.S. PATENT DOCUMENTS

| | | | |
|---|---|---|---|
| 8,242,589 B2 | 8/2012 | Saen et al. | |
| 8,604,621 B2* | 12/2013 | Itaya | H01L 21/76898 438/668 |
| 8,773,157 B2 | 7/2014 | Badaroglu et al. | |
| 9,513,330 B2 | 12/2016 | Vukic et al. | |
| 10,541,212 B2* | 1/2020 | Bonart | H01L 23/53209 |
| 2010/0171226 A1* | 7/2010 | West | H01L 23/481 257/774 |
| 2011/0031581 A1* | 2/2011 | West | H01L 23/481 257/774 |
| 2011/0080184 A1 | 4/2011 | Wu et al. | |
| 2012/0097944 A1* | 4/2012 | Lin | H01L 25/0657 257/E23.002 |
| 2014/0070838 A1* | 3/2014 | Vukic | G01R 31/2853 324/762.03 |
| 2014/0167045 A1* | 6/2014 | Bian | H01L 22/30 438/689 |

(Continued)

OTHER PUBLICATIONS

G. Di Natale; et al. "Built-in self-test for manufacturing TSV defects before bonding," 2014 IEEE 32nd VLSI Test Symposium (VTS), Apr. 13-17, 2014, pp. 1-6.

(Continued)

*Primary Examiner* — Ida M Soward
(74) *Attorney, Agent, or Firm* — JCIPRNET

(57) ABSTRACT

A through-substrate via (TSV) test structure including a substrate, a first TSV, and a test device is provided. The substrate includes a test region. The first TSV is located in the substrate of the test region. The test device is located on the substrate of the test region. The test device and the first TSV are separated from each other. The shortest distance between the test device and the first TSV is less than 10 μm.

19 Claims, 4 Drawing Sheets

(56) References Cited

U.S. PATENT DOCUMENTS

| | | | |
|---|---|---|---|
| 2014/0264733 A1* | 9/2014 | Yuan | H10D 1/20 |
| | | | 438/675 |
| 2015/0097185 A1* | 4/2015 | Bae | H01L 22/14 |
| | | | 257/48 |
| 2015/0160289 A1* | 6/2015 | Kolluru | H01L 22/14 |
| | | | 324/762.03 |
| 2016/0225678 A1* | 8/2016 | Zhou | H01L 29/0657 |
| 2018/0174933 A1 | 6/2018 | Kim et al. | |
| 2019/0273033 A1* | 9/2019 | Shih | H01L 23/481 |
| 2019/0385995 A1 | 12/2019 | Metras et al. | |
| 2021/0057328 A1* | 2/2021 | Lee | H01L 23/5222 |
| 2021/0175133 A1* | 6/2021 | Choi | H01L 23/544 |
| 2021/0208187 A1* | 7/2021 | Lillibridge | B81C 1/00095 |
| 2022/0344278 A1* | 10/2022 | Yamaguchi | H01L 23/544 |
| 2023/0044131 A1* | 2/2023 | Park | H01L 25/50 |
| 2023/0197537 A1* | 6/2023 | Geiger | H01L 22/34 |
| | | | 257/48 |

OTHER PUBLICATIONS

K. Fang; et al., "TSV Prebond Test Method Based on Switched Capacitors," in IEEE Transactions on Very Large Scale Integration (VLSI) Systems, vol. 27, No. 1, Jan. 2019, pp. 205-218.

"Office Action of Taiwan Counterpart Application", issued on Sep. 7, 2022, p. 1-p. 7.

* cited by examiner

THROUGH-SUBSTRATE VIA TEST STRUCTURE

CROSS-REFERENCE TO RELATED APPLICATION

This application claims the priority benefit of Taiwanese application no. 111108657, filed on Mar. 9, 2022. The entirety of the above-mentioned patent application is hereby incorporated by reference herein and made a part of this specification.

BACKGROUND OF THE INVENTION

Field of the Invention

The invention relates to a semiconductor structure, and particularly relates to a through-substrate via (TSV) test structure.

Description of Related Art

In the wafer stage, it is difficult to detect the integrity and the quality of the TSV on the wafer by the general wafer test method (e.g., wafer acceptance test (WAT) method). Therefore, it is difficult to detect whether the TSV is abnormal in the wafer stage.

SUMMARY OF THE INVENTION

The invention provides a TSV test structure, which can detect whether the TSV is abnormal in the wafer stage.

The invention provides a TSV test structure, which includes a substrate, a first TSV, and a test device. The substrate includes a test region. The first TSV is located in the substrate of the test region. The test device is located on the substrate of the test region. The test device and the first TSV are separated from each other. The shortest distance between the test device and the first TSV is less than 10 μm (micrometer).

According to an embodiment of the invention, in the TSV test structure, the first TSV may protrude from the top surface of the substrate.

According to an embodiment of the invention, in the TSV test structure, in the wafer stage, the bottom surface of the first TSV may be located in the substrate, and the bottom surface of the first TSV is not connected to any conductive component.

According to an embodiment of the invention, in the TSV test structure, in a chip packaging stage, the bottom surface of the first TSV may be connected to a conductive component.

According to an embodiment of the invention, in the TSV test structure, the test device may be an active device.

According to an embodiment of the invention, in the TSV test structure, the active device is, for example, a transistor device.

According to an embodiment of the invention, in the TSV test structure, the test device may be a passive device.

According to an embodiment of the invention, in the TSV test structure, the passive device is, for example, a capacitor device.

According to an embodiment of the invention, in the TSV test structure, the shortest distance between the test device and the first TSV may be less than or equal to 5 μm.

According to an embodiment of the invention, in the TSV test structure, the shortest distance between the test device and the first TSV may be less than or equal to 2 μm.

According to an embodiment of the invention, the TSV test structure may further include a dielectric layer. The dielectric layer is located on the substrate, the first TSV, and the test device. A portion of the first TSV may extend into the dielectric layer.

According to an embodiment of the invention, the TSV test structure may further include a first interconnect structure and a second interconnect structure. The first interconnect structure is located in the dielectric layer and is electrically connected to the first TSV. The second interconnect structure is located in the dielectric layer and is electrically connected to the test device.

According to an embodiment of the invention, in the TSV test structure, the substrate may include a scribe line region and a chip region.

According to an embodiment of the invention, in the TSV test structure, the test region may be located in the scribe line region or the chip region.

According to an embodiment of the invention, in the TSV test structure, the substrate may further include a device region. The device region may be located in the chip region.

According to an embodiment of the invention, the TSV test structure may further include a second TSV. The second TSV is located in the substrate of the device region.

According to an embodiment of the invention, in the TSV test structure, the shortest distance between the test device and the second TSV may be greater than or equal to 10 μm.

According to an embodiment of the invention, in the TSV test structure, the second TSV may protrude from the top surface of the substrate.

According to an embodiment of the invention, in the TSV test structure, in the wafer stage, the bottom surface of the second TSV may be located in the substrate, and the bottom surface of the second TSV is not connected to any conductive component.

According to an embodiment of the invention, in the TSV test structure, in a chip packaging stage, the bottom surface of the second TSV may be connected to a conductive component.

Based on the above description, the TSV test structure according to the invention includes the TSV and the test device located in the test region, and the shortest distance between the test device and the TSV is less than 10 μm, so the stress of the TSV will affect the electrical property (e.g., threshold voltage ($V_t$), on-current ($I_{on}$), or capacitance) of the test device. In this way, the TSV test structure can detect whether the TSV is abnormal in the wafer stage. For example, the TSV test method using the TSV test structure can refer to the following description. The "normal electrical property data" of the test device that is separated from the normal TSV by a specific distance can be obtained in advance. When the TSV is abnormal (e.g., the structure of the TSV is incomplete or has a void), the stress of the TSV will change, which changes the electrical property of the test device. That is, when the TSV is abnormal, the measured electrical property data of the test device will be different from the above "normal electrical property data", so it can be determined that the TSV in the test region is abnormal, and then it can be known that the TSV in the device region is abnormal (e.g., the structure of the TSV is incomplete or has a void). In addition, the TSV test can be compatible with the wafer acceptance test. Furthermore, the process of the TSV in the test region can be integrated with the process of the TSV in the device region, and the process of the test device in the test region can be integrated with the process of the semiconductor device in the device region, so no additional process is required.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. Furthermore, the features in the top view and the features in the cross-sectional view are not drawn to the same scale. In fact, the dimensions of the various features may be arbitrarily increased or reduced for clarity of discussion.

Figure 1:
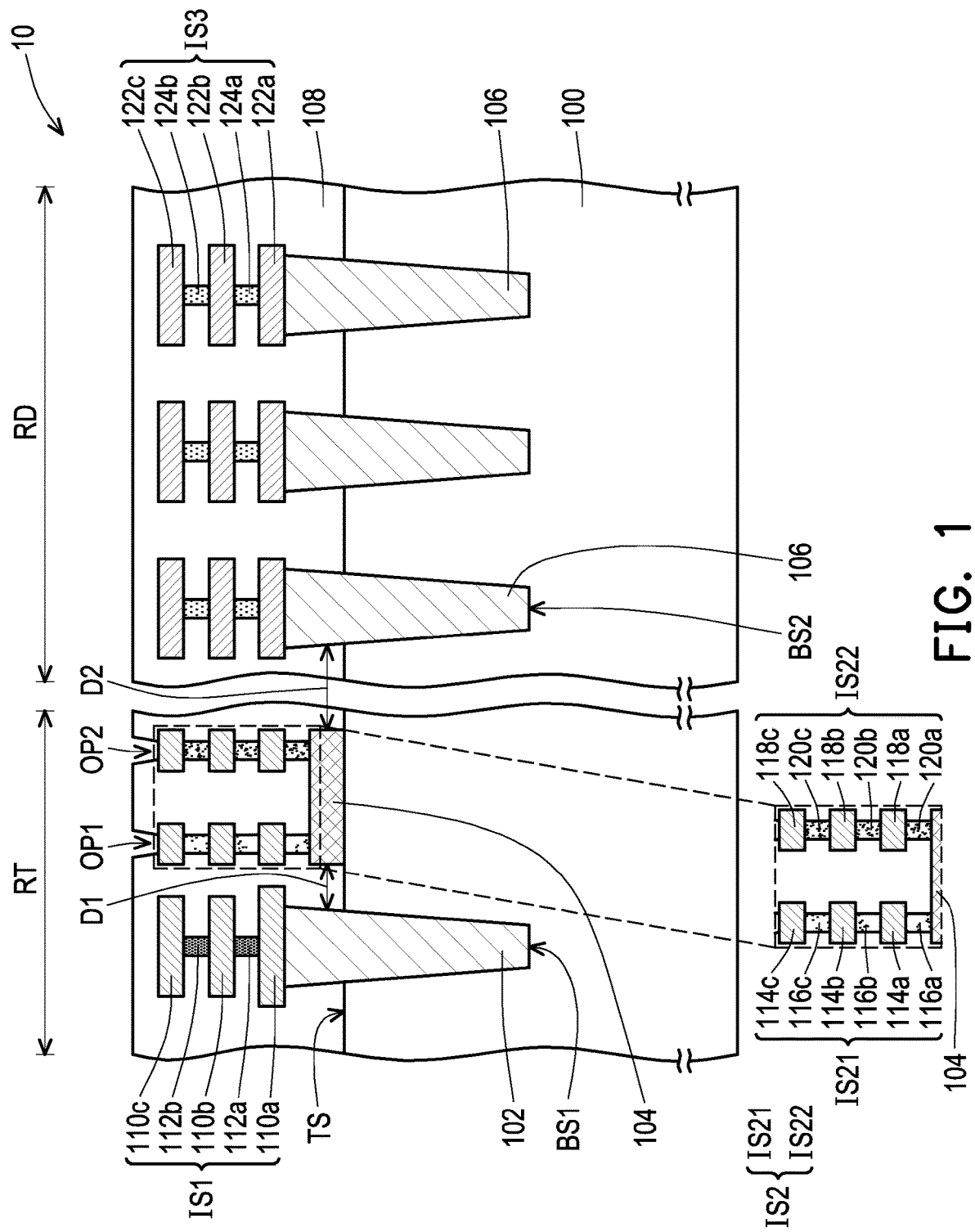
FIG. 1 is a cross-sectional view illustrating a TSV test structure according to some embodiments of the invention.
Figure 2:
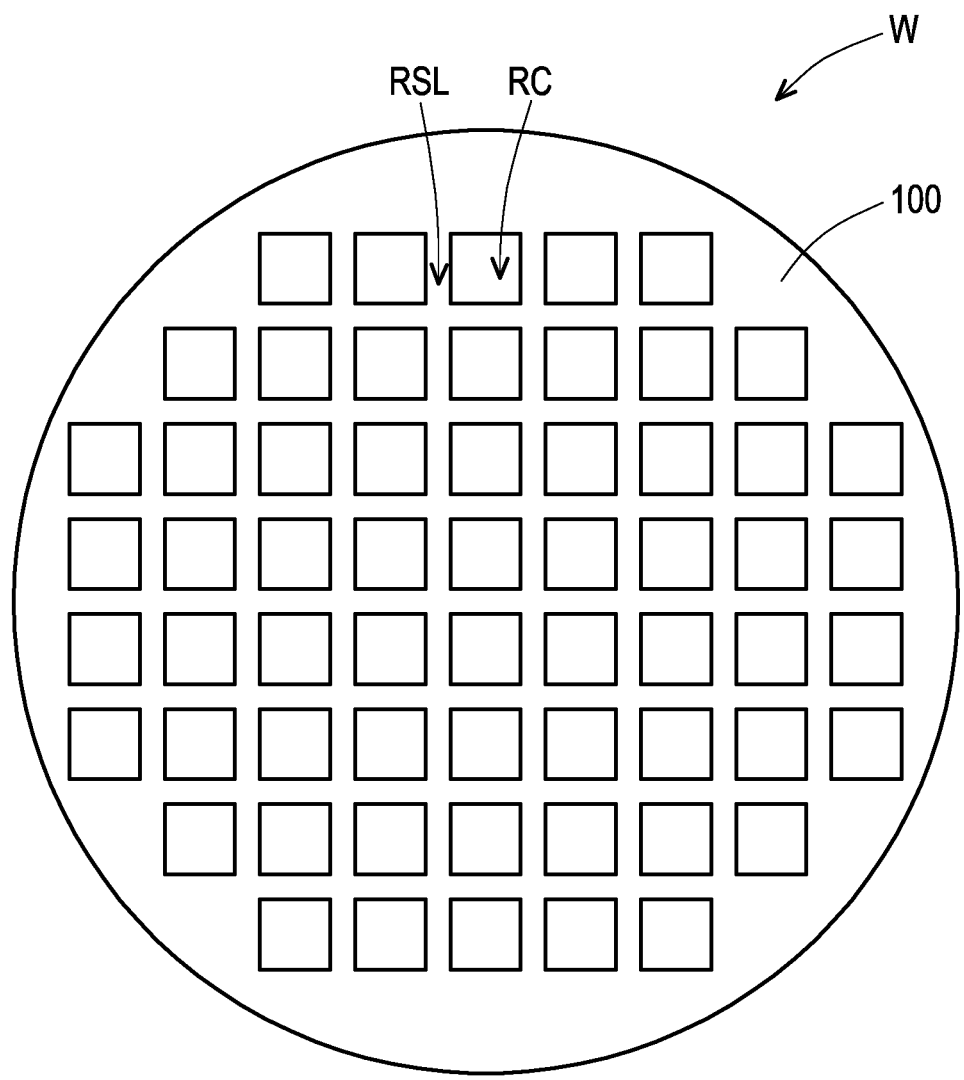
FIG. 2 is a top view illustrating a wafer according to some embodiments of the invention.
Figure 3:
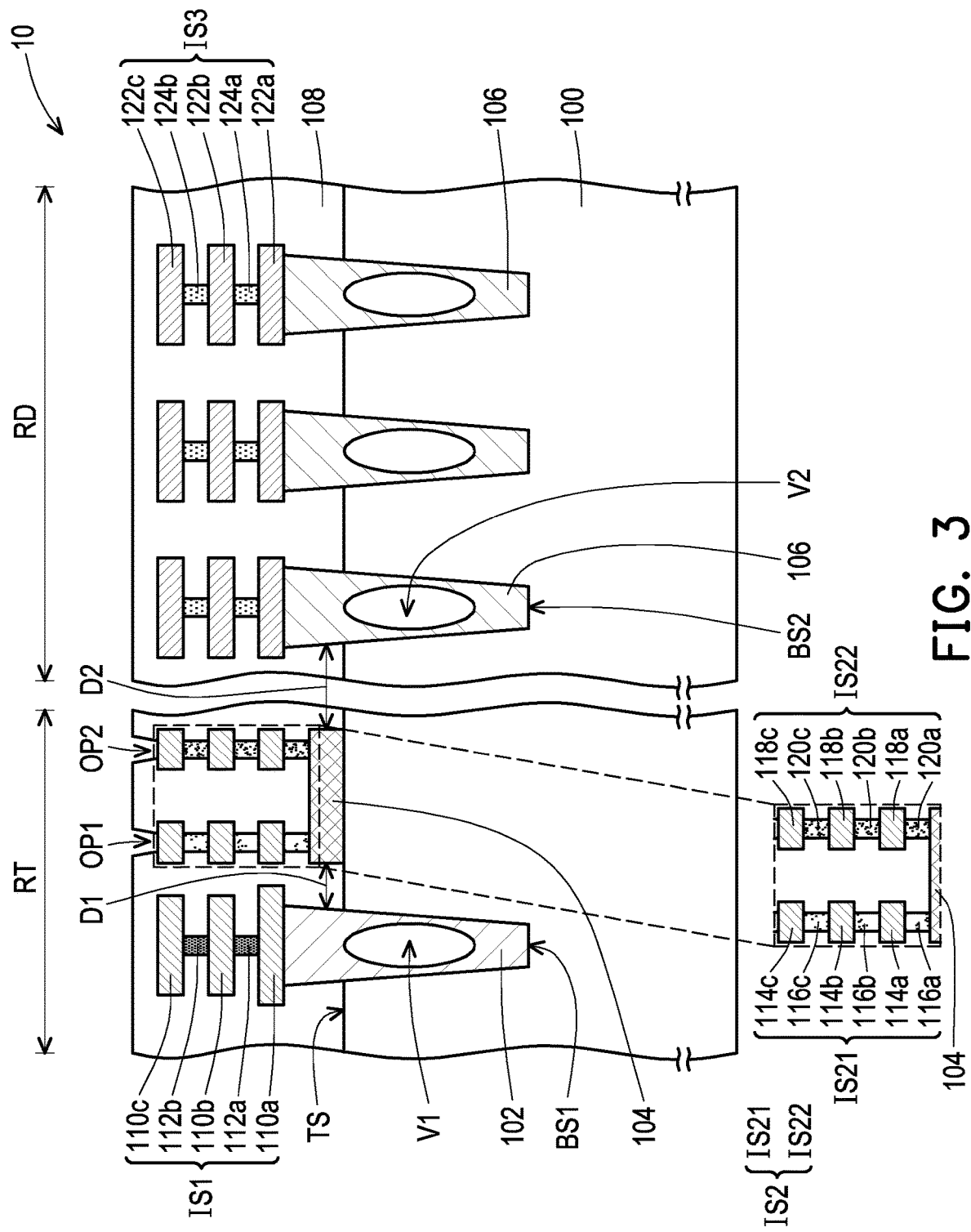
FIG. 3 is a cross-sectional view illustrating a TSV test structure according to other embodiments of the invention.

FIG. 1 is a cross-sectional view illustrating a TSV test structure according to some embodiments of the invention. FIG. 2 is a top view illustrating a wafer according to some embodiments of the invention. FIG. 3 is a cross-sectional view illustrating a TSV test structure according to other embodiments of the invention.

Referring to FIG. 1A, a TSV test structure 10 includes a substrate 100, a TSV 102, and a test device 104. The substrate 100 may be a semiconductor substrate such as a silicon substrate. In the present embodiment, as shown in FIG. 2, the substrate 100 may be the substrate of the wafer W, but the invention is not limited thereto. As shown in FIG. 1, the substrate 100 includes a test region RT. In some embodiments, as shown in FIG. 2, the substrate 100 may include a scribe line region RSL and a chip region RC. The scribe line region RSL may be used to define the chip region RC. The test region RT of FIG. 1 may be located in the scribe line region RSL or the chip region RC of FIG. 2. In addition, as shown in FIG. 1, the substrate 100 may further include a device region RD. The device region RD of FIG. 1 may be located in the chip region RC of FIG. 2. In some embodiments, the device region RD may be a logical device region or a memory device region, but the invention is not limited thereto. Furthermore, although not shown in FIG. 1, the required component such as a doped region and/or an isolation structure may be included in the substrate 100, and the semiconductor device (e.g., an active device and/or a passive device) may be included on the substrate 100 of the device region RD, and the description thereof is omitted here.

The TSV 102 is located in the substrate 100 of the test region RT. In some embodiments, the TSV 102 may protrude from the top surface TS of the substrate 100. In some embodiments, in the wafer stage, the bottom surface BS1 of the TSV 102 may be located in the substrate 100, and the bottom surface BS1 of the TSV 102 is not connected to any conductive component. That is, in the wafer stage, the bottom surface BS1 of the TSV 102 may be in a floating state. The material of the TSV 102 is, for example, a conductive material such as copper.

The test device 104 is located on the substrate 100 of the test region RT. The test device 104 and the TSV 102 are separated from each other. In the present embodiment, the test device 104 may be located on the top surface TS of the substrate 100, but the invention is not limited thereto. In other embodiments, the test device 104 may be located in substrate 100. As long as the test device 104 is located on at least a portion of the substrate 100, it falls within the scope of the invention. The shortest distance D1 between the test device 104 and the TSV 102 is less than 10 μm, so the stress of the TSV 102 will affect the electrical property of the test device 104. In some embodiments, the shortest distance D1 between the test device 104 and the TSV 102 may be less than or equal to 5 μm. In some embodiments, the shortest distance D1 between the test device 104 and the TSV 102 may be less than or equal to 2 μm. In some embodiments, the test device 104 may be an active device. The active device is, for example, a transistor device. In some embodiments, the test device 104 may be a passive device. The passive device is, for example, a capacitor device.

The TSV test structure 10 may further include a TSV 106. The TSV 106 is located in the substrate 100 of the device region RD. In some embodiments, the TSV 106 may protrude from the top surface TS of the substrate 100. In some embodiments, in the wafer stage, the bottom surface BS2 of the TSV 106 may be located in the substrate 100, and the bottom surface BS2 of the TSV 106 is not connected to any conductive component. That is, in the wafer stage, the bottom surface BS2 of the TSV 106 may be in a floating state. The shortest distance D2 between the test device 104 and the TSV 106 may be greater than or equal to 10 μm. The material of the TSV 106 is, for example, a conductive material such as copper. Furthermore, the number of the TSVs 106 is not limited to the number in the drawing. As long as the number of the TSVs 106 is one or more, it falls within the scope of the invention.

The TSV test structure 10 may further include a dielectric layer 108. The dielectric layer 108 is located on the substrate 100, the TSV 102, and the test device 104. In addition, the dielectric layer 108 may be located on the TSV 106. A portion of the TSV 102 may extend into the dielectric layer 108. A portion of the TSV 106 may extend into the dielectric layer 108. In some embodiments, the dielectric layer 108 may be a multilayer structure. The material of the dielectric layer 108 is, for example, silicon oxide, silicon nitride, or a combination thereof.

The TSV test structure 10 may further include an interconnect structure IS1 and an interconnect structure IS2. The interconnect structure IS1 is located in the dielectric layer 108 and is electrically connected to the TSV 102. In the present embodiment, the interconnect structure IS1 may include a conductive layer 110a, a conductive layer 110b, a conductive layer 110c, a via 112a, and a via 112b, but the invention is not limited thereto. One of ordinary skill in the art may adjust the structure of the interconnect structure IS1 according to the product requirement. The conductive layer 110a, the conductive layer 110b, and the conductive layer 110c are sequentially located on the TSV 102. The via 112a is located between the conductive layer 110a and the conductive layer 110b. The via 112b is located between the conductive layer 110b and the conductive layer 110c. In the present embodiment, the TSV 102 may be directly connected to the conductive layer 110a, but the invention is not limited thereto. In other embodiments, the TSV 102 may be directly connected to another conductive layer (e.g., conductive layer 110b) in the interconnect structure IS1 according to the product requirement. The materials of the conductive layer 110a, the conductive layer 110b, and the conductive layer 110c are, for example, metal such as aluminum, copper, or tungsten. The materials of the via 112a and the via 112b are, for example, metal such as tungsten.

The interconnect structure IS2 is located in the dielectric layer 108 and is electrically connected to the test device 104. In the present embodiment, the interconnect structure IS2 may include an interconnect structure IS21 and an interconnect structure IS22, but the invention is not limited thereto. One of ordinary skill in the art may adjust the structure of the interconnect structure IS2 according to the product requirement. The interconnect structure IS21 and the interconnect structure IS22 may be electrically connected to the input terminal and the output terminal of the test device 104, respectively. Moreover, the dielectric layer 108 may have an opening OP1 and an opening OP2. The opening OP1 and the opening OP2 expose the interconnect structure IS21 and the interconnect structure IS22, respectively. When the TSV 102 is tested, the probes may contact the interconnect structure IS21 and the interconnect structure IS22 respectively exposed by the opening OP1 and the opening OP2.

In the present embodiment, the interconnect structure IS21 may include a conductive layer 114a, a conductive layer 114b, a conductive layer 114c, a contact 116a, a via 116b, and a via 116c, but the invention is not limited thereto. One of ordinary skill in the art may adjust the structure of the interconnect structure IS21 according to the product requirement. The conductive layer 114a, the conductive layer 114b, and the conductive layer 114c are sequentially located on the test device 104. The contact 116a is located between the conductive layer 114a and the test device 104. The via 116b is located between the conductive layer 114a and the conductive layer 114b. The via 116c is located between the conductive layer 114b and the conductive layer 114c. In the present embodiment, the conductive layer 114c may be used as a pad, and the opening OP1 may expose the conductive layer 114c. The materials of the conductive layer 114a, the conductive layer 114b, and the conductive layer 114c are, for example, metal such as aluminum, copper, or tungsten. The materials of the contact 116a, the via 116b, and the via 116c are, for example, metal such as tungsten.

In the present embodiment, the interconnect structure IS22 may include a conductive layer 118a, a conductive layer 118b, a conductive layer 118c, a contact 120a, a via 120b, and a via 120c, but the invention is not limited thereto. One of ordinary skill in the art may adjust the structure of the interconnect structure IS22 according to the product requirement. The conductive layer 118a, the conductive layer 118b, and the conductive layer 118c are sequentially located on the test device 104. The contact 120a is located between the conductive layer 118a and the test device 104. The via 120b is located between the conductive layer 118a and the conductive layer 118b. The via 120c is located between the conductive layer 118b and the conductive layer 118c. In the present embodiment, the conductive layer 118c may be used as a pad, and the opening OP2 may expose the conductive layer 118c. The materials of the conductive layer 118a, the conductive layer 118b, and the conductive layer 118c are, for example, metal such as aluminum, copper, or tungsten. The materials of the contact 120a, the via 120b, and the via 120c are, for example, metal such as tungsten.

The TSV test structure 10 may further include an interconnect structure IS3. The interconnect structure IS3 is located in the dielectric layer 108 and is electrically connected to the TSV 106. In the present embodiment, the interconnect structure IS3 may include a conductive layer 122a, a conductive layer 122b, a conductive layer 122c, a via 124a, and a via 124b, but the invention is not limited thereto. One of ordinary skill in the art may adjust the structure of the interconnect structure IS3 according to the product requirement. The conductive layer 122a, the conductive layer 122b, and the conductive layer 122c are sequentially located on the TSV 106. The via 124a is located between the conductive layer 122a and the conductive layer 122b. The via 124b is located between the conductive layer 122b and the conductive layer 122c. In the present embodiment, the TSV 106 may be directly connected to the conductive layer 122a, but the invention is not limited thereto. In other embodiments, the TSV 106 may be directly connected to another conductive layer (e.g., conductive layer 122b) in the interconnect structure IS3 according to the product requirement. The materials of the conductive layer 122a, the conductive layer 122b, and the conductive layer 122c are, for example, metal such as aluminum, copper, or tungsten. The materials of the via 124a and the via 124b are, for example, metal such as tungsten. In addition, the number of the interconnect structures IS3 is not limited to the number in the drawing. As long as the number of the interconnect structure IS3 is one or more, it falls within the scope of the invention.

Based on the above embodiments, the TSV test structure 10 includes the TSV 102 and the test device 104 located in the test region RT, and the shortest distance D1 between the test device 104 and the TSV 102 is less than 10 μm, so the stress of the TSV 102 will affect the electrical property (e.g., threshold voltage ($V_t$), on-current ($I_{on}$), or capacitance) of the test device 104. In this way, the TSV test structure 10 can detect whether the TSV 102 is abnormal.

For example, the TSV test method using the TSV test structure 10 can refer to the following description. As shown in FIG. 1, the "normal electrical property data" of the test device 104 that is separated from the normal TSV 102 by a specific distance (e.g., distance D0 can be obtained in advance. As shown in FIG. 3, when the TSV 102 is abnormal (e.g., the structure of the TSV 102 is incomplete or has a void V1), the stress of the TSV 102 will change, which changes the electrical property of the test device 104. That is, when the TSV 102 is abnormal, the measured electrical property data of the test device 104 will be different from the above "normal electrical property data", so it can be determined that the TSV 102 in the test region RT is abnormal, and then it can be known that the TSV 106 in the device region RD is abnormal (e.g., the structure of the TSV 106 is incomplete or has a void V2).

In addition, the TSV test can be compatible with the wafer acceptance test. Furthermore, the process of the TSV 102 in the test region RT can be integrated with the process of the TSV 106 in the device region RD, and the process of the test device 104 in the test region RT can be integrated with the process of the semiconductor device (not shown) in the device region RD, so no additional process is required.

Figure 4:
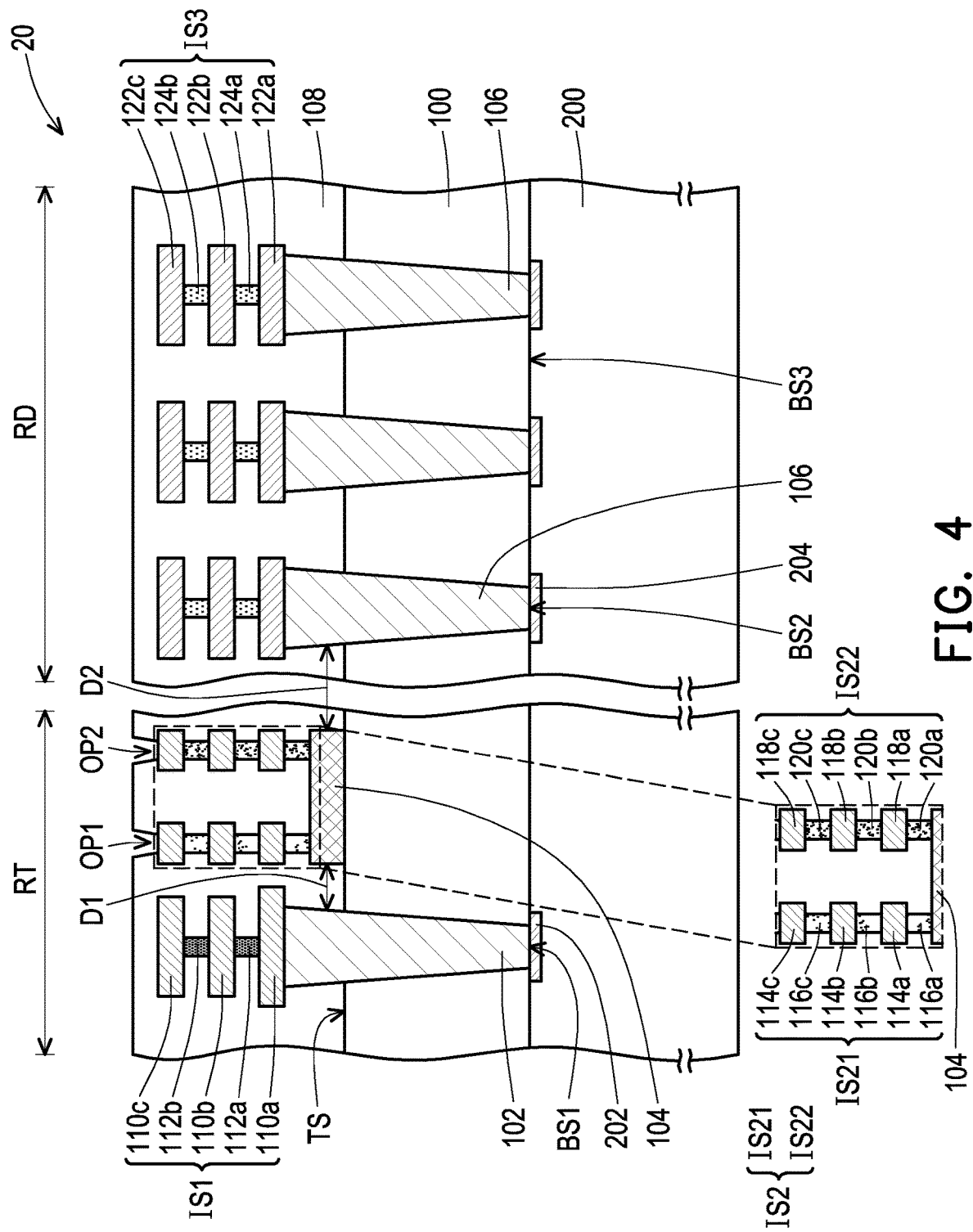
FIG. 4 is a cross-sectional view illustrating a TSV test structure according to other embodiments of the invention.

FIG. 4 is a cross-sectional view illustrating a TSV test structure according to other embodiments of the invention.

Referring to FIG. 1 and FIG. 4, the difference between the TSV test structure 20 of FIG. 4 and the TSV test structure 10 of FIG. 1 is as follows. In FIG. 4, the TSV test structure 20 is the structure of the chip packaging stage. In the present embodiment, the substrate 100 may be the substrate of the chip. The TSV 102 and the TSV 106 may pass through the bottom surface BS3 of the substrate 100. In the chip packaging stage, if the test region RT is to be remained in the TSV test structure 20, the test region RT must be located in the chip region RC. In addition, the TSV test structure 20 may further include a chip 200. The chip 200 and the substrate 100 may be bonded to each other. The chip 200 may be a semiconductor chip with a specific function. In some embodiments, the chip 200 may include a pad 202 and a pad 204. In some embodiments, in the chip packaging stage, the bottom surface BS1 of the TSV 102 may be connected to a conductive component (e.g., pad 202). That is, in the chip packaging stage, the bottom surface BS1 of the TSV 102 is not in a floating state. In some embodiments, in the chip packaging stage, the bottom surface BS2 of the TSV 106 may be connected to a conductive component (e.g., pad 204). That is, in the chip packaging stage, the bottom surface BS2 of the TSV 106 is not in a floating state. Furthermore, the same components in the TSV test structure and the TSV test structure 10 are denoted by the same reference symbols, and the same or similar content in the TSV test structure 20 and the TSV test structure 10 may be referred to the description of the TSV test structure 10 in the foregoing embodiments, and the description thereof is omitted.

In summary, the TSV test structure of the aforementioned embodiments includes the TSV and the test device located in the test region, and the shortest distance between the test device and the TSV is less than 10 μm, so the stress of the TSV will affect the electrical property of the test device. In this way, the TSV test structure can detect whether the TSV is abnormal in the wafer stage. In addition, the TSV test can be compatible with the wafer acceptance test. Furthermore, the process of the TSV in the test region can be integrated with the process of the TSV in the device region, and the process of the test device in the test region can be integrated with the process of the semiconductor device in the device region, so no additional process is required.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A through-substrate via (TSV) test structure, comprising:
    a substrate comprising a test region;
    a first TSV located in the substrate of the test region; and
    a test device located on the substrate of the test region, wherein the test device and the first TSV are separated from each other, and a shortest distance between the test device and the first TSV is less than 10 μm, wherein the substrate comprises a scribe line region and a chip region, and
    there is no conductive component between the first TSV and the test device.

2. The TSV test structure according to claim 1, wherein the first TSV protrudes from a top surface of the substrate.

3. The TSV test structure according to claim 1, wherein in a wafer stage, a bottom surface of the first TSV is located in the substrate, and the bottom surface of the first TSV is not connected to any conductive component.

4. The TSV test structure according to claim 1, wherein in a chip packaging stage, a bottom surface of the first TSV is connected to a conductive component.

5. The TSV test structure according to claim 1, wherein the test device comprises an active device.

6. The TSV test structure according to claim 5, wherein the active device comprises a transistor device.

7. The TSV test structure according to claim 1, wherein the test device comprises a passive device.

8. The TSV test structure according to claim 7, wherein the passive device comprises a capacitor device.

9. The TSV test structure according to claim 1, wherein the shortest distance between the test device and the first TSV is less than or equal to 5 μm.

10. The TSV test structure according to claim 1, wherein the shortest distance between the test device and the first TSV is less than or equal to 2 μm.

11. The TSV test structure according to claim 1, further comprising:
    a dielectric layer located on the substrate, the first TSV, and the test device, wherein a portion of the first TSV extends into the dielectric layer.

12. The TSV test structure according to claim 11, further comprising:
    a first interconnect structure located in the dielectric layer and electrically connected to the first TSV; and
    a second interconnect structure located in the dielectric layer and electrically connected to the test device.

13. The TSV test structure according to claim 1, wherein the test region is located in the scribe line region or the chip region.

14. The TSV test structure according to claim 1, wherein the substrate further comprises a device region, wherein the device region is located in the chip region.

15. The TSV test structure according to claim 14, further comprising:
    a second TSV located in the substrate of the device region.

16. The TSV test structure according to claim 15, wherein a shortest distance between the test device and the second TSV is greater than or equal to 10 μm.

17. The TSV test structure according to claim 15, wherein the second TSV protrudes from a top surface of the substrate.

18. The TSV test structure according to claim 15, wherein in a wafer stage, a bottom surface of the second TSV is located in the substrate, and the bottom surface of the second TSV is not connected to any conductive component.

19. The TSV test structure according to claim 15, wherein in a chip packaging stage, a bottom surface of the second TSV is connected to a conductive component.

* * * * *